United States Patent
Kang et al.

[11] Patent Number: 6,159,849
[45] Date of Patent: Dec. 12, 2000

[54] METHODS OF FORMING NITRIDE DIELECTRIC LAYERS HAVING REDUCED EXPOSURE TO OXYGEN

[75] Inventors: Seong-hun Kang; Young-lark Koh; Jung-kyu Lee, all of Seoul, Rep. of Korea

[73] Assignee: Samsung Electronics Co., Ltd., Rep. of Korea

[21] Appl. No.: 09/021,005

[22] Filed: Feb. 9, 1998

[30] Foreign Application Priority Data

Mar. 31, 1997 [KR] Rep. of Korea ............... 97-11900

[51] Int. Cl.⁷ .................. H01L 21/44; H01L 21/8242
[52] U.S. Cl. .................. 438/665; 438/255; 438/398
[58] Field of Search .................. 438/665, 255, 438/398, 486, 482, 396, 253

[56] References Cited

U.S. PATENT DOCUMENTS

| | | | |
|---|---|---|---|
| 5,234,862 | 8/1993 | Aketagawa et al. | 437/103 |
| 5,366,917 | 11/1994 | Watanabe et al. | 437/47 |
| 5,372,962 | 12/1994 | Hirota et al. | 437/47 |
| 5,385,863 | 1/1995 | Tatsumi et al. | |
| 5,394,012 | 2/1995 | Kimura | 257/739 |
| 5,405,801 | 4/1995 | Han et al. | 437/60 |
| 5,464,791 | 11/1995 | Hirota | 437/60 |
| 5,486,488 | 1/1996 | Kamiyama | 437/60 |
| 5,543,347 | 8/1996 | Kawano et al. | 437/60 |
| 5,554,557 | 9/1996 | Koh | 437/52 |
| 5,567,637 | 10/1996 | Hirota | 437/43 |
| 5,590,051 | 12/1996 | Yokozawa | 364/496 |
| 5,595,937 | 1/1997 | Mikagi | 437/192 |
| 5,616,511 | 4/1997 | Hirota | 438/396 |
| 5,623,243 | 4/1997 | Watanabe et al. | 257/309 |
| 5,691,228 | 11/1997 | Ping et al. | 438/486 |
| 5,754,390 | 5/1998 | Sandhu et al. | 361/311 |
| 5,893,980 | 4/1999 | Cho | 216/2 |
| 5,917,213 | 6/1999 | Iyer et al. | 257/309 |
| 5,937,314 | 8/1999 | Ping et al. | 438/486 |
| 5,960,294 | 9/1999 | Zahurak et al. | 438/398 |

FOREIGN PATENT DOCUMENTS 4-286151  10/1992  Japan.

OTHER PUBLICATIONS

H. Watanabe et al., An Advanced Fabrication Technology of Hemispherical Grained (HSG) Poly–Si for High Capacitance Storage Electrodes, Extended Abstracts of the 1991 International Conference on Solid State Devices and Materials, Yokohama, Aug. 27–19, 1991, pp. 478–480.

H. Watanabe et al., Hemispherical Grained Silicon (HSG–Si) Formation on In–Situ Phosphorous Doped Amorphous–Si Using The Seeding Method, Extended Abstracts of the 1992 International Conference on Solid State Devices and Materials, Tsukuba, Aug. 26–28, 1992, pp. 422–424.

H. Watanabe et al., A New Cylindrical Capacitor Using Hemispherical Grained Si (HSG–Si) for 256Mb DRAMs, 1992 IEEE, IEDM, 10.1.1–10.1.4, pp. 259–262.

*Primary Examiner*—Charles Bowers
*Assistant Examiner*—Thanh Nguyen
*Attorney, Agent, or Firm*—Myers Bigel Sibley & Sajovec

[57] ABSTRACT of A method of forming a dielectric layer includes the steps of forming an electrode on a microelectronic substrate, and forming depressions and protrusions on exposed portions of the electrode thereby increasing a surface area thereof. An exposed portion of the electrode including the depressions and protrusions is nitrified, and the electrode is not exposed to oxygen during and between the steps of forming the depressions and protrusions and nitrifying the exposed portion of the electrode. A nitride layer is then formed on a nitrified electrode. Related structures are also discussed.

27 Claims, 5 Drawing Sheets

METHODS OF FORMING NITRIDE DIELECTRIC LAYERS HAVING REDUCED EXPOSURE TO OXYGEN

FIELD OF THE INVENTION

The present invention relates to the field of electronics and more particularly to methods of forming dielectric layers and related structures.

BACKGROUND OF THE INVENTION

Integrated circuit memory devices such as dynamic random access memories (DRAM) can be more highly integrated by reducing the size of each memory cell thereby increasing a memory capacity thereof. In particular, dynamic random access memories have been developed with memory capacities of 16M, 64M, and even 256M. Accordingly, there continues to exist a need to provide memory cells of ever decreasing size.

A DRAM generally includes a MOS (metal oxide semiconductor) transistor and a capacitor. The capacitor includes a lower (storage) electrode and an upper (plate) electrode separated by a thin dielectric layer therebetween. The capacitance of this capacitor is proportional to the effective capacitor electrode area and inversely proportional to the distance between the two electrodes which is determined by the thickness of the dielectric layer. As it may be desirable to maintain a predetermined capacitance despite reductions in the memory cell area, it may be desirable to increase the effective capacitor electrode area per unit area of substrate, to provide a dielectric material having a relatively high permittivity, or to reduce the thickness of the dielectric layer.

Several techniques have thus been developed to provide memory cell capacitors having a predetermined capacitance on reduced areas of the substrate. In particular, capacitor electrodes having three-dimensional structures can be provided. For example, stack structures, trench structures, cylindrical structures, and capacitor over bit-line (COB) structures can be provided. These structures may be difficult to implement in highly integrated circuit memory devices, however, because of the increased expense and complexity required during manufacture. These structures may also result in design rule limitations. Furthermore, it may be difficult to obtain sufficient and stable capacitances using these structures.

Capacitor electrode surface areas have also been increased by the formation of hemispherical grained silicon layers. FIG. 1 is a flow chart illustrating steps of a method of forming a capacitor including the formation of a hemispherical grained silicon layer. FIG. 2 is a flow chart illustrating steps of a method of forming a hemispherical grained silicon layer on the lower electrode of the semiconductor capacitor.

Referring to FIG. 1, a lower electrode pattern is formed 101 wherein the lower capacitor electrode of the memory cell capacitor is electrically coupled with a source of a MOS transistor through contact holes in an insulating layer. The lower capacitor electrode can be used to store a bit of information wherein the access transistor allows data to be written to or read from the capacitor. The lower capacitor electrode can be an amorphous silicon layer formed by low pressure chemical vapor deposition wherein the amorphous silicon layer can be phosphorous doped or undoped. In addition, the insulating layer between the lower capacitor electrode and the substrate can be a silicon oxide layer. Moreover, the amorphous silicon layer can be patterned using conventional photolithography and etch steps to form the lower electrode pattern 101.

A hemispherical grained silicon layer is then formed 103 on the exposed surface of the lower capacitor electrode pattern. The formation of hemispherical grained silicon layers is discussed for example in the reference by Watanabe et al. entitled "Hemispherical Grained Silicon Formation on In-Situ Phosphorous Doped Amorphous-Si Using The Seeding Method," SSDM, 1992, pp. 422–424. The disclosure of this reference is hereby incorporated herein in its entirety by reference.

In particular, a hemispherical grained silicon layer can be formed at the transition temperature range of crystalline silicon and amorphous silicon through silicon migration so that its surface energy is stabilized. In addition, the silicon containing gas such as silane ($SiH_4$) or disilane ($Si_2H_6$) can provide an active reaction at the surface of the lower electrode, or silicon from within the electrode can migrate to form protrusions. In addition, seeds can be used to provide surface roughness. The capacitance of the resulting capacitor can thus be increased due to the increased surface area of the lower capacitor electrode.

Steps of a method for forming a hemispherical grained silicon layer are shown in FIG. 2. A temperature inside a high vacuum chemical vapor deposition apparatus including a resistive heating source is maintained at a constant temperature during a temperature stabilization step 111. For example, the temperature can be maintained at approximately 580° C. Molecules of disilane ($Si_2H_6$) or silane ($SiH_4$) are then irradiated on the surface of the lower capacitor electrode to provide a seeding gas during a seeding step 113. Silane and disilane both have active surface reactions with the amorphous silicon of the electrode. A thermal treatment 115 is then carried out to form the hemispherical grained (HSG) silicon layer. The surface of the electrode is thus roughened with hemispherical grains due to the thermal migration of silicon particles. After forming the hemispherical grained silicon layer, a wet etch step 104 is performed to remove a native oxide which may form on the surface of the electrode prior to forming a nitride dielectric layer.

A nitridation step 105 is then performed on a native oxide on the surface of the lower electrode by flowing ammonia gas over the exposed portion of the electrode at a temperature of approximately 800° C. A silicon nitride layer is then formed 106 on the nitrified lower electrode at a temperature in the range of 600° C. to 700° C.

A portion of the nitride layer is then dry-oxidized or wet-oxidized in step 107 to cure the nitride layer. Accordingly, the dielectric layer includes nitride and oxide layers. An upper capacitor electrode is then formed 108 by forming and patterning a second conductive layer.

In the method discussed above, a wet-etch is used to remove a native oxide layer prior to the formation of the nitride layer. This wet-etch step, however, may also wear down the surface of the hemispherical grained silicon layer thereby reducing a surface area thereof. The resulting capacitor may thus have a capacitance reduced by as much as ten percent. In addition, the leakage current of the resulting capacitor may be increased at the interface of the lower electrode and the hemispherical grained silicon layer because of abrasion due to the silicon etching.

Furthermore, when a hemispherical grained silicon layer is formed at the transition temperature range of crystalline silicon and amorphous silicon, the resulting hemispherical grained silicon layer may be sensitive to temperature variations. Accordingly, it may be difficult to maintain a uniform size and density of hemispherical silicon grains between wafers within a processing run and between processing runs. In other words, there may be insufficient processing margins so that undesirable variations in capacitance result.

SUMMARY OF THE INVENTION

It is therefore an object of the present invention to provide improved methods of forming integrated circuit capacitors and related structures.

It is another object of the present invention to provide methods of forming capacitor electrodes having increased surface areas and related structures.

It is yet another object of the present invention to provide methods of forming capacitors having increased capacitances and related structures.

These and other objects are provided according to the present invention by methods including the steps of forming an electrode on a microelectronic substrate, forming depressions and protrusions on an exposed portion of the electrode, and nitrifying the exposed portion of the electrode including the depressions and protrusions wherein the electrode is not exposed to oxygen during and between the steps of forming the depressions and protrusions and nitrifying the exposed portion of the electrode. A nitride layer is then formed on the nitrified electrode. Accordingly, the formation of native oxide layers on the electrode between the steps of forming the depressions and protrusions and nitrifying the exposed portion of the electrode is reduced.

The step of forming the depressions and protrusions can include forming hemispherical grained silicon layer on the electrode. Alternately, the step of forming the depressions and protrusions can include seeding metallic particles on the electrode and performing a thermal treatment on the exposed portion of the electrode. These metallic particles may react with the exposed portion of the electrode to form a silicide during the thermal treatment thus providing the depressions and protrusions. According to yet another alternative, the step of forming the depressions and protrusions can include exciting the exposed portion of the electrode and performing a thermal treatment on the exposed portion of the electrode. The electrode can be excited by providing a plasma discharge of a gas such as helium, hydrogen, argon, or nitrogen, or by providing a plasma discharge of a gas including an element such as arsenic or phosphorous. Alternately, the electrode can be excited using ultraviolet radiation.

The depressions and protrusions can be formed and nitrified in-situ using a common processing chamber. Alternately, these steps can be performed in separate processing chambers of a multi-chamber processing system including a vacuum loadlock chamber for transferring the substrate between the steps. In either case, exposure to oxygen is reduced between the steps thus reducing the formation of any native oxide layers.

In addition, the step of forming the electrode can be preceded by the step of forming an insulating layer on the microelectronic substrate wherein the insulating layer has a contact hole therein exposing a portion of the substrate. Moreover, the electrode can be electrically coupled with the exposed portion of the substrate through the contact hole. Accordingly, the storage electrode of a memory cell capacitor can be electrically coupled with a memory cell transistor thereby providing a DRAM memory cell. In addition, a second electrode can be formed on the nitride layer opposite the first electrode to provide opposing capacitor electrodes separated by the nitride layer.

According to an alternate aspect of the present invention, a capacitor can include a first capacitor electrode on a substrate wherein a surface of the first capacitor electrode has depressions and protrusions thereon centered around metallic particles opposite the substrate. The capacitor can also include a dielectric layer on a first capacitor electrode including the depressions and protrusions, and a second capacitor electrode on the dielectric layer opposite the first capacitor electrode.

According to the methods and structures of the present invention, the surface area of a capacitor electrode can be increased. Accordingly, the capacitance of the resulting capacitor can be increased, and the performance of a memory device including such a capacitor can be increased.

DETAILED DESCRIPTION

Figure 1:
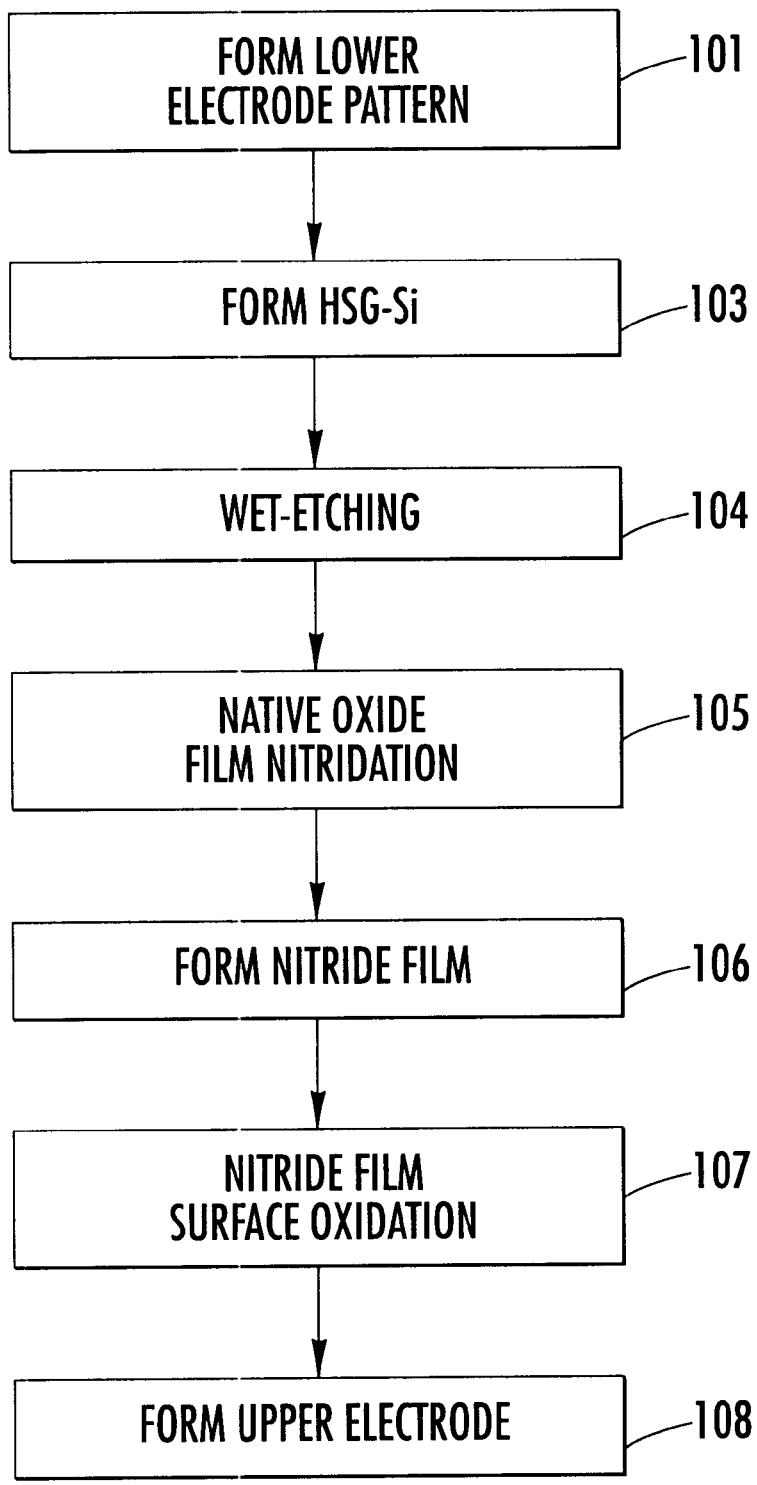
FIG. 1 is a flow chart illustrating steps of a method of forming an integrated circuit capacitor according to the prior art.
Figure 2:
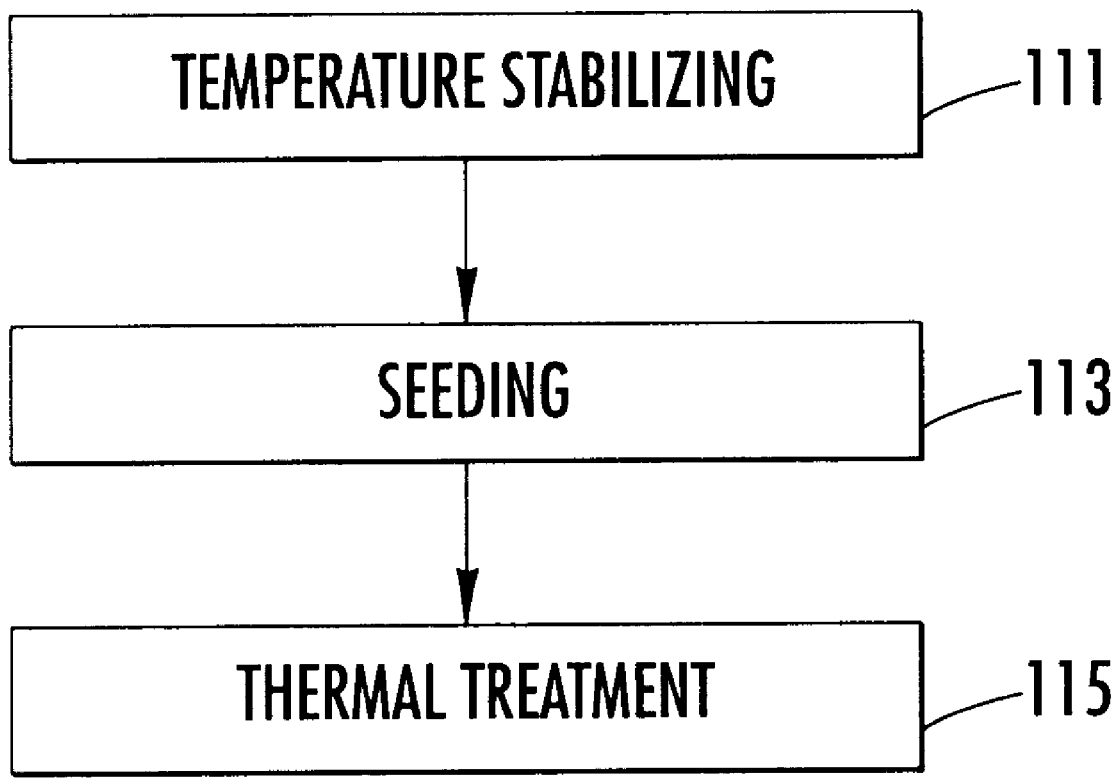
FIG. 2 is a flow chart illustrating steps of a method of forming hemispherical grained silicon layers according to FIG. 1.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 3:
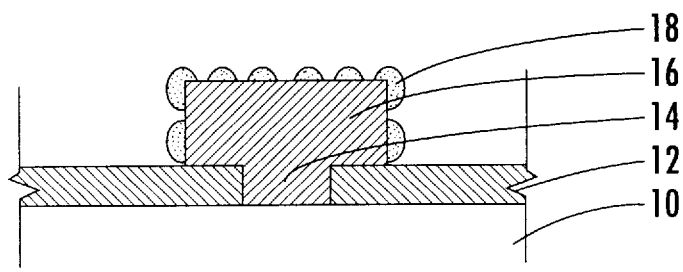
FIGS. 3–5 are cross-sectional views illustrating steps of a first method of forming an integrated circuit capacitor according to the present invention.

A first method according to the present invention will now be discussed with reference to FIGS. 3–6. As shown in FIG. 3, an insulating layer 12 is formed on a semiconductor substrate 10, and contact holes 14 are formed in the insulating layer 12 exposing portions of the substrate 10. More particularly, a memory cell transistor can be formed on the substrate 10 prior to forming the insulating layer 12, and the contact hole 14 can expose a source/drain region of the memory cell transistor. A layer of a conductive material such as amorphous silicon is then deposited on the insulating layer 12 and patterned to provide the lower capacitor electrode 16. More particularly, an amorphous silicon layer can be formed using chemical vapor deposition, and the amorphous silicon layer can be doped with a dopant such as phosphorous during the deposition thereof. Alternately, the amorphous silicon layer can be undoped. The amorphous silicon layer can be patterned using photolithography and etch steps to provide the lower capacitor electrode 16.

A hemispherical grained silicon layer 18 is formed on the exposed surfaces of the lower capacitor electrode 16. This hemispherical grained silicon layer can be formed using the seeding method discussed in the reference by Watanabe et al. entitled "Hemispherical Grained Silicon Formation on In-Situ Phosphorous Doped Amorphous-Si Using The Seeding Method." This reference (cited above) is hereby incorporated herein in its entirety by reference.

Figure 4:
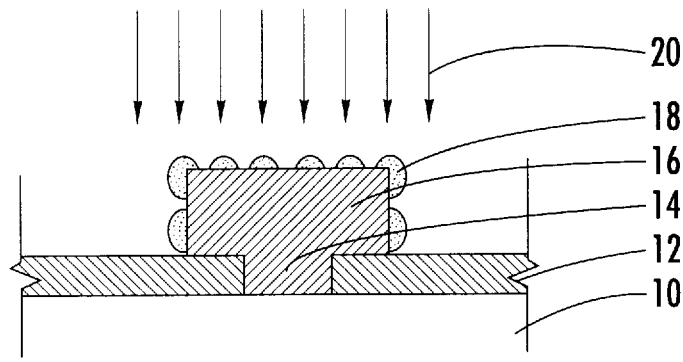

As shown in FIG. 4, the surface of the lower capacitor electrode 16 including the hemispherical grained silicon layer 18 is subjected to a nitridation step. The nitridation step is preferably performed after the formation of the hemispherical grained silicon layer 18 without intervening exposure to oxygen. Accordingly, formation of any undesired native oxide thereon can be reduced. In particular, the steps of forming the hemispherical grained silicon layer 18 and nitrifying the surface of the lower capacitor electrode can be performed in-situ in the same processing chamber. The temperature can be maintained in the range of 700° C. to 900° C. after forming the hemispherical grained silicon layer 18 while maintaining a vacuum within the deposition chamber, and then the thermal nitridation step can be performed by flowing a gas 20 including nitrogen such as $NH_3$, $N_2O$, $N_2$, or mixtures thereof.

Alternately, the step of forming the hemispherical grained silicon layer 18 and the nitridation step can be performed separately in a multi-channel deposition system including a loadlock chamber used to transfer wafers from one sub-chamber to the next. The loadlock chamber can thus be used to maintain a vacuum without oxygen to reduce the formation of a native oxide on the surface of the lower capacitor electrode between the steps of forming the hemispherical grained silicon layer and nitrifying the lower capacitor electrode. The conditions used to perform the nitridation step can be the same as those discussed above when the nitridation step is performed in the same chamber used to form the hemispherical grained silicon layer.

The nitridation step can be carried out using a plasma discharge within the chemical vapor deposition processing chamber containing the gas including nitrogen. In other words, the plasma nitridation of the surface of the lower capacitor electrode can be carried out so that the plasma discharge occurs inside a chemical vapor deposition processing chamber maintained at a high vacuum state with a plasma generator installed. Moreover, an ionized gas including nitrogen or an ionized mixture of gases including nitrogen collide on the hemispherical grained silicon layer including concave and convex portions (depressions and protrusions) thereby plasma nitrifying the surface of the hemispherical grained silicon layer.

As discussed above, the step of forming the hemispherical grained silicon layer 18 and the step of nitrifying the hemispherical grained silicon layer 18 can be performed in-situ in the same processing chamber. Alternately, these steps can be performed separately in a multi-chamber deposition system including a high vacuum loadlock chamber for transferring wafers between chambers. The loadlock chamber is maintained at a high vacuum state without oxygen to reduce the formation of a native oxide on the surface of the lower electrode. In addition, the plasma nitridation and the thermal nitridation can be performed in the same processing chamber to compensate for reduced nitridation on sidewalls of the lower capacitor electrode.

Figure 5:
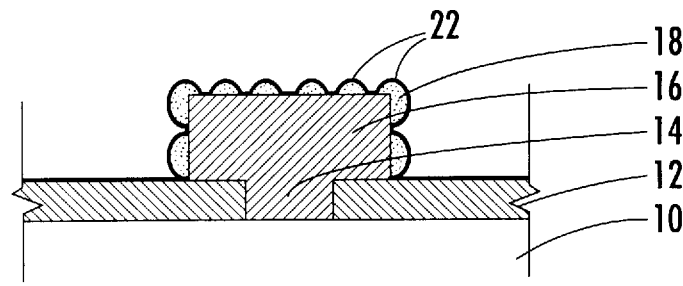

As shown in FIG. 5, a nitride dielectric layer 22 is formed at a temperature in the range of 600° C. to 700° C. This nitride layer can be formed in-situ following the nitridation step. Furthermore, the steps of nitridation and forming the nitride layer can be performed in a common processing chamber. A dry-etch or a wet-etch can then be performed on the nitride layer 22 to form a nitride-oxide (NO) dielectric layer. An upper electrode is then formed on the dielectric layer.

Figure 6:
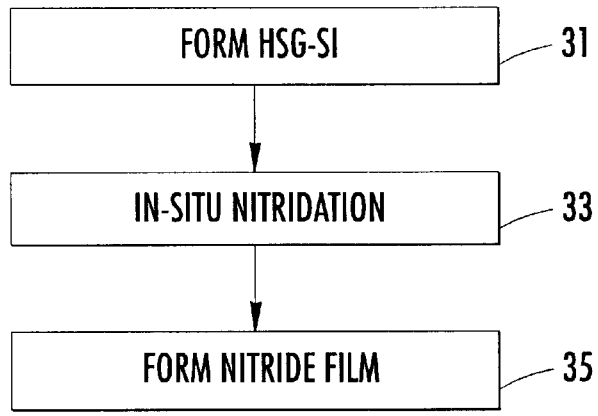
FIG. 6 is a flow chart illustrating steps of the first method of forming an integrated circuit capacitor according to the present invention.

Steps of the first method of the present invention are shown in FIG. 6. In particular, a hemispherical grained silicon layer is formed 31 on the lower capacitor electrode. An in-situ nitridation step 33 is performed on the hemispherical grained silicon layer, and a nitride film is formed 35 on the hemispherical grained silicon layer. By reducing the formation of a native oxide prior to the nitridation step, the use of a wet-etch prior to the nitridation step can be eliminated. Accordingly, an increased surface area of the hemispherical grained silicon layer can be maintained.

Figure 7:
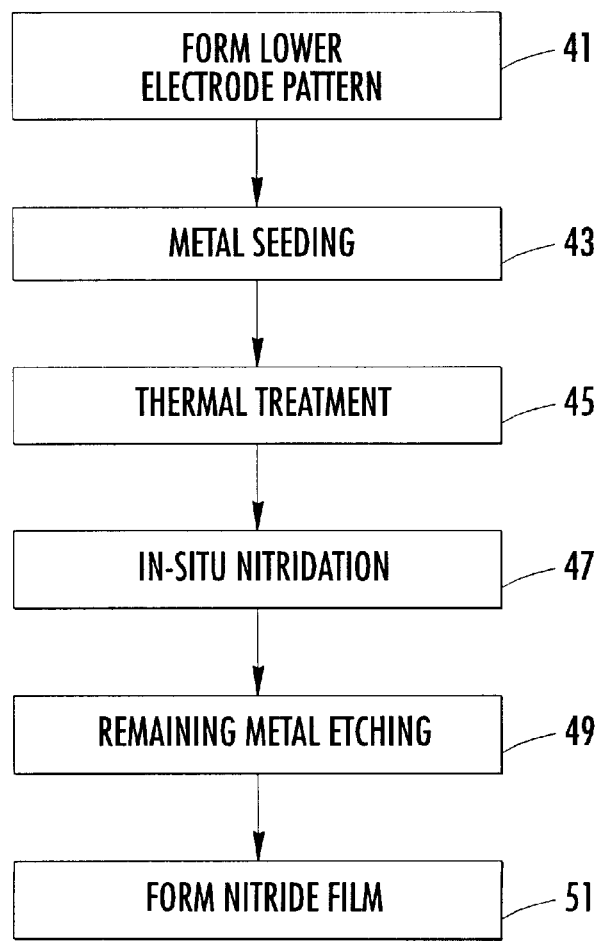
FIG. 7 is a flow chart illustrating steps of a second method of forming an integrated circuit capacitor according to the present invention.

A second method according to the present invention will now be discussed with reference to the flow chart of FIG. 7. In particular, the surface area of the lower capacitor electrode is increased by seeding metallic particles on the surface of the lower capacitor electrode and subjecting the seeded electrode to a thermal treatment. The lower capacitor electrode is formed 41 as discussed above with regard to the first method of the present invention. The exposed surface of the lower capacitor electrode is then seeded with metallic particles 43. These metallic particles react with the amorphous silicon of the lower capacitor electrode during a thermal treatment 45 to form a silicide. Concave and convex portions (depressions and protrusions) of the lower capacitor electrode are thus formed centered around the metallic particles. The metallic particles are preferably particles of a metal such as tungsten (W) or titanium (Ti) which reacts with silicon to form a silicide. The seeding step can be performed at a temperature in the range of 100° C. to 1,000° C. for a period of time in the range of a few seconds to dozens of seconds using a chemical vapor deposition technique. The thermal treatment can be performed at a temperature in the range of 600° C. to 1,000° C.

A subsequent nitridation step 47 is then performed on the surface of the lower capacitor electrode having the concave and convex portions using a thermal treatment as discussed above. This nitridation step can be carried out in-situ using the same processing chamber used for the metallic seeding and thermal treatment steps. Alternately, the nitridation step can be carried out separately in a separate chamber of a multi-chamber processing system including a high vacuum state loadlock chamber for transferring the wafers between sub-chambers. Accordingly, exposure to oxygen can be reduced between the step of forming the concave and convex portions and the step of nitridation. The nitridation of the lower capacitor electrode can be carried out using a plasma discharge inside the chemical vapor deposition processing chamber while providing a gas including nitrogen. In other words, the plasma nitridation can be performed wherein a plasma discharge is provided within a high vacuum chemical vapor deposition processing chamber including a plasma generator. An ionized gas including nitrogen thus collides with the lower capacitor electrode having the concave and convex portions so that the surface is nitrified. As discussed above, the thermal treatment and nitridation steps can be performed in-situ in a common processing chamber, or the steps can be performed in separate chambers of a multi-chamber processing system having a high vacuum loadlock chamber for transferring wafers between sub-processing chambers.

Nitridation of the lower electrode is followed by a metal etch step 49 wherein metallic particles are removed from portions of the insulating layer around the lower capacitor electrode. The metallic particles can be removed by a wet-etch using sulfuric acid thereby reducing leakage currents which may result if metallic particles remain on the insulating layer between lower capacitor electrodes.

A nitride layer is then formed 51 on the nitrified lower capacitor electrode. The surface of the nitride layer can be oxidized to provide a nitride-oxide (NO) dielectric layer. An upper capacitor electrode can then be formed on the dielectric layer completing the capacitor structure.

Figure 8:
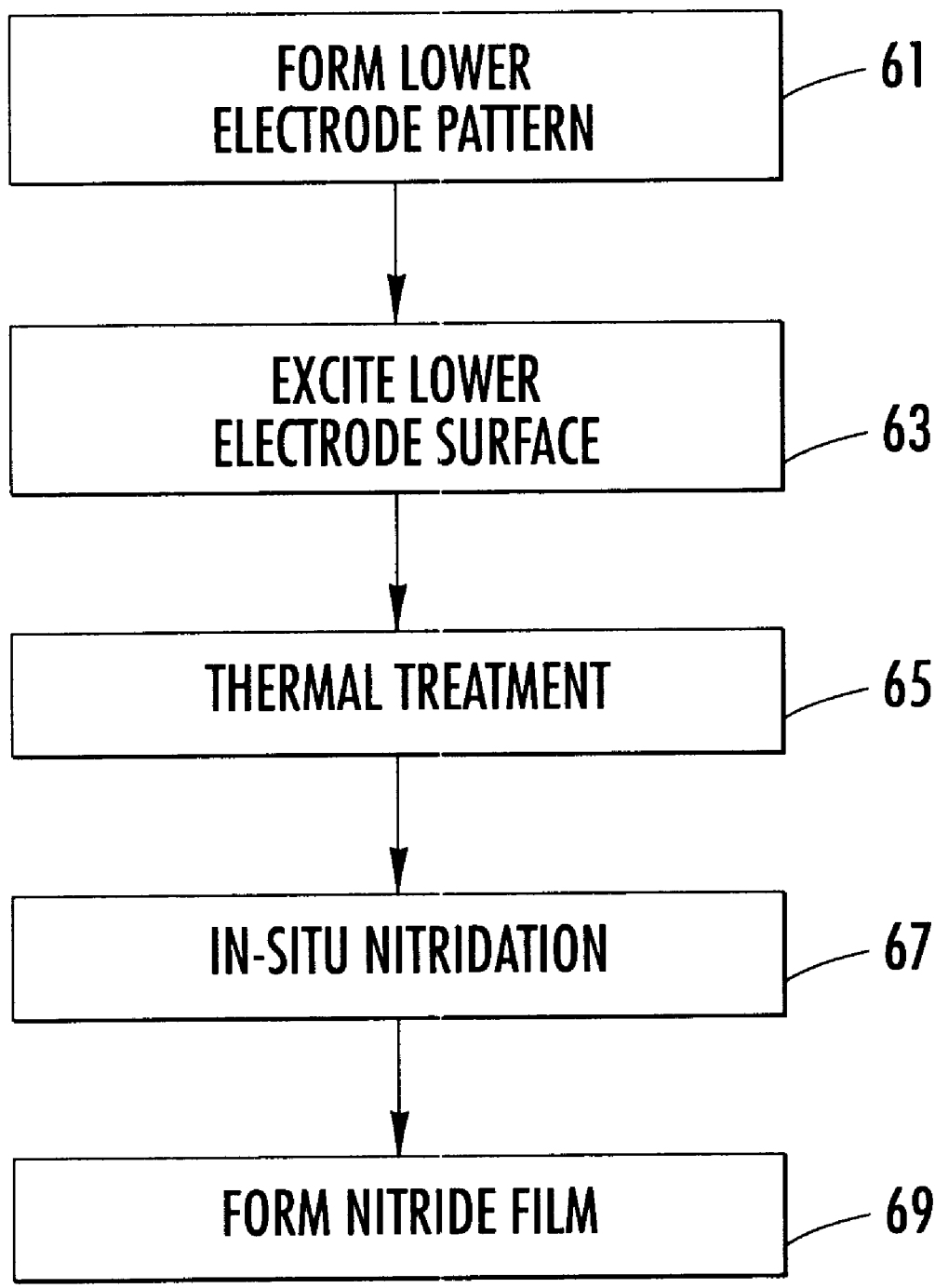
FIG. 8 is a flow chart illustrating steps of a third method of forming an integrated circuit capacitor according to the present invention.

Steps of a third method of forming a capacitor structure according to the present invention are illustrated in the flowchart of FIG. 8. A lower capacitor electrode is formed 61 as discussed above with regard to the first and second methods of the present invention. The exposed surface of the lower capacitor electrode is then excited 63 by exposing the lower capacitor electrode to a plasma discharge. In particular, the plasma discharge can be performed using a gas such as helium (He), hydrogen (H), argon (Ar), or nitrogen (N), or mixtures thereof. In addition, the plasma-discharge can be performed using arsenic (As) or phosphorous (P), or mixtures thereof. Alternately, the exposed portion of the lower capacitor electrode can be excited by irradiating the surface with ultraviolet radiation.

A thermal treatment 65 is then performed on the lower capacitor electrode to form concave and convex portions (depressions and protrusions) thereon. A nitridation step 67 is then performed on the surface of the lower capacitor electrode including the concave and convex portions using a thermal treatment. The nitridation step can be carried out in-situ in the same processing chamber used to provide the surface excitation step and thermal treatment. Alternately, the nitridation step can be performed in a separate chamber of a multi-chamber processing system including a vacuum loadlock chamber for transferring the wafer thereby reducing exposure to oxygen. The nitridation of the surface of the lower electrode is performed using a plasma discharge inside a chemical vapor deposition processing chamber containing a gas including nitrogen.

In other words, the plasma-nitridation is carried out so that a plasma discharge occurs inside a high vacuum chemical vapor deposition processing chamber including a plasma generator. An ionized gas including nitrogen thus collides with the lower capacitor electrode having concave and convex portions to provide surface nitridation. As discussed above, these steps can be performed in-situ in a common processing chamber, or these steps can be performed in separate chambers of a multi-chamber processing system including a vacuum loadlock chamber for transferring wafers between sub-chambers. A nitride film is then formed 69 as discussed above with regard to the first and second methods of the present invention. The surface of the nitride film can be oxidized to provide a nitride-oxide dielectric layer. An upper capacitor electrode is then formed on the dielectric layer opposite the first capacitor electrode.

According to the methods of the present invention, a conventional wet-etch step used to remove native oxide layers prior to the nitridation step can be eliminated because the surface of the lower capacitor electrode is nitrified in-situ after forming the hemispherical grained silicon layer. These methods can also reduce the processing time and reduce surface abrasion of the hemispherical grained silicon layer to provide an increased surface area for the lower capacitor electrode and to provide increased capacitance for the resulting capacitor.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a dielectric layer, said method comprising the steps of:

forming a silicon electrode on a microelectronic substrate;

forming depressions and protrusions on an exposed portion of said silicon electrode thereby increasing a surface area thereof;

nitrifying said exposed portion of said silicon electrode including said depressions and protrusions wherein said silicon electrode is not exposed to oxygen during and between said step of forming said depressions and protrusions and said step of nitrifying said exposed portion of said silicon electrode; and forming a nitride layer on said nitrified silicon electrode;

wherein said step of forming said depressions and protrusions on said exposed portion of said silicon electrode and said step of nitrifying said exposed portion of said silicon electrode are performed in-situ in a common processing chamber.

2. A method according to claim 1 wherein said step of forming said depressions and protrusions comprises forming a hemispherical grained silicon layer on said electrode.

3. A method according to claim 2 wherein said step of forming said hemispherical grained silicon layer comprises seeding said exposed portion of said electrode with a seed gas including silicon, and performing a thermal treatment on said seeded electrode.

4. A method according to claim 1 wherein said step of forming said depressions and protrusions comprises seeding metallic particles on said exposed portion of said electrode and performing a thermal treatment on said exposed portion of said electrode.

5. A method according to claim 4 wherein said nitrifying step is followed by the step of removing said metallic particles from portions of said substrate surrounding said electrode.

6. A method according to claim 5 wherein said removing step comprises a wet etch.

7. A method according to claim 4 wherein said metallic particles react with said exposed portion of said electrode to form a silicide during said thermal treatment.

8. A method according to claim 4 wherein said metallic particles comprise a metal chosen from the group consisting of tungsten (W) and titanium (Ti).

9. A method according to claim 4 wherein said seeding step is performed at a temperature in the range of 100° C. to 1000° C.

10. A method according to claim 4 wherein said thermal treatment is performed at a temperature in the range of 600° C. to 1000° C.

11. A method according to claim 1 wherein said step of forming said depressions and protrusions comprises exciting said exposed portion of said electrode and performing a thermal treatment on said exposed portion of said electrode.

12. A method according to claim 11 wherein said step of exciting said exposed portion of said electrode comprises providing a plasma discharge adjacent said exposed portion of said electrode.

13. A method according to claim 12 wherein said step of providing said plasma discharge comprises providing a plasma discharge of a gas chosen from the group consisting of helium (He), hydrogen (H), argon (Ar), and nitrogen (N).

14. A method according to claim 11 wherein said step of providing said plasma discharge comprises providing a plasma discharge of a gas including an element chosen from the group consisting of arsenic (As) and phosphorous (P).

15. A method according to claim 11 wherein said exciting step comprises irradiating said exposed portion of said electrode with ultraviolet radiation.

16. A method according to claim 11 wherein said thermal treatment is performed at a temperature in the range of 600° C. to 1000° C.

17. A method according to claim 1 wherein said step of forming said depressions and protrusions and said step of nitrifying said exposed portion of said electrode are performed separately in separate processing chambers within a multi-chamber processing system including a vacuum loadlock chamber for transferring said substrate between said separate processing chambers.

18. A method according to claim 1 wherein said electrode comprises amorphous silicon.

19. A method according to claim 18 wherein said amorphous silicon electrode is doped with phosphorous.

20. A method according to claim 1 wherein said step of nitrifying said exposed portion of said electrode comprises providing a nitrogen containing gas adjacent said electrode while heating said electrode.

21. A method according to claim 1 wherein said nitrifying step comprises discharging a plasma including nitrogen adjacent said exposed portion of said electrode including said depressions and protrusions.

22. A method according to claim 1 wherein said nitrifying step comprises providing a nitrogen containing gas adjacent said electrode while heating said electrode and discharging a plasma adjacent said electrode.

23. A method according to claim 1 wherein said nitrifying step and said step of forming said nitride layer a performed in-situ in a common reaction chamber.

24. A method according to claim 1 wherein said step of forming said nitride layer is followed by the step of oxidizing a surface of said nitride layer opposite said electrode.

25. A method according to claim 1 wherein said step of forming said electrode is preceded by the step of:
    forming an insulating layer on said microelectronic substrate wherein said insulating layer has a contact hole therein exposing a portion of said substrate and wherein said electrode is electrically coupled with said exposed portion of said substrate through said contact hole.

26. A method according to claim 1 further comprising the step of:
    forming a second electrode on said nitride layer opposite said first electrode.

27. A method of forming a dielectric layer, said method comprising the steps of:
    forming a silicon electrode on a microelectronic substrate;
    forming depressions and protrusions on an exposed portion of said silicon electrode thereby increasing a surface area thereof;
    nitrifying said exposed portion of said silicon electrode including said depressions and protrusions wherein said silicon electrode is not exposed to oxygen during and between said step of forming said depressions and protrusions and said step of nitrifying said exposed portion of said silicon electrode; and
    forming a nitride layer on said nitrified silicon electrode;
    wherein said step of forming said depressions and protrusions and said step of nitrifying said exposed portion of said electrode are performed separately in separate processing chambers within a multi-chamber processing system including a vacuum loadlock chamber for transferring said substrate between said separate processing chambers.

* * * * *

UNITED STATES PATENT AND TRADEMARK OFFICE
CERTIFICATE OF CORRECTION

PATENT NO. : 6,159,849
DATED : December 12, 2000
INVENTOR(S) : Seong-hun Kang

It is certified that error appears in the above-identified patent and that said Letters Patent is hereby corrected as shown below:

Claim 17, column 9,
Lines 13-19 please delete claim 17.

Signed and Sealed this

Ninth Day of October, 2001

Attest:

*Nicholas P. Godici*

NICHOLAS P. GODICI
*Attesting Officer*    *Acting Director of the United States Patent and Trademark Office*